United States Patent [19]

Martens et al.

[11] 3,784,452

[45] Jan. 8, 1974

[54] METHOD OF TREATING THE SURFACE OF SUPERCONDUCTING NIOBIUM CAVITY RESONATORS

[75] Inventors: Hans Martens; Heinrich Diepers; Alfred Muller; Rai-Ko Sun, all of Erlangen, Germany

[73] Assignee: Siemens Aktiengesellschaft, Erlangen, Germany

[22] Filed: Feb. 10, 1972

[21] Appl. No.: 225,110

[30] Foreign Application Priority Data

Feb. 12, 1971 Germany.......................... 2106628

[52] U.S. Cl................. 204/26, 204/32 R, 204/56 R

[51] Int. Cl........................... C23b 5/56, C23b 5/50

[58] Field of Search................. 204/26, 56 R, 32 R; 330/45, 56

[56] References Cited

UNITED STATES PATENTS

| | | | |
|---|---|---|---|
| 3,687,823 | 8/1972 | Lugscheider et al. | 204/26 |
| 3,436,258 | 4/1969 | Neugebauer et al. | 204/56 R |
| 3,378,471 | 4/1968 | Vermilyea | 204/56 R |
| 3,314,867 | 4/1967 | Gore et al. | 204/32 R |

*Primary Examiner*—T. Tufariello
*Attorney*—Arthur E. Wilfond et al.

[57] ABSTRACT

A process for improving the surface quality of superconducting niobium cavity resonators. The process comprises at least partially providing the resonator cavity with a niobium oxide layer by anocid oxidation.

8 Claims, 1 Drawing Figure

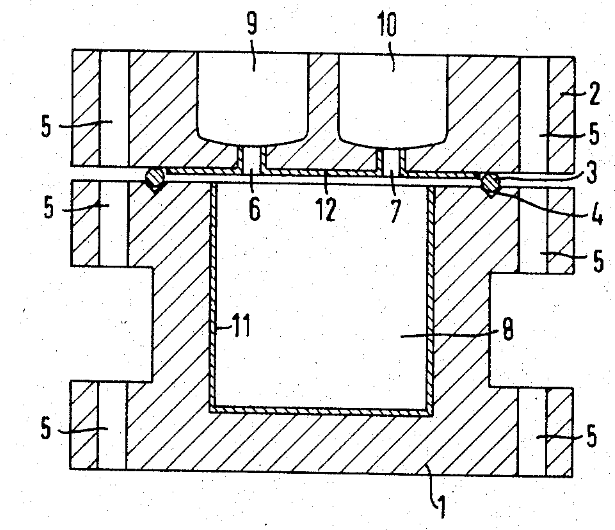
9
10
2
5
5
3
5
6
12
7
4
5
11
8
5
5
1

METHOD OF TREATING THE SURFACE OF SUPERCONDUCTING NIOBIUM CAVITY RESONATORS

The present invention relates to a method of treating the surfaces of superconducting niobium cavity resonators.

Superconducting cavity resonators, particularly those suitable for particle accelerators, utilize the super-conductivity of a surface layer of superconducting material. Since the depth of penetration into the superconducting material of the alternating currents produced by the microwave fields in the wall of the cavity resonators, is only very slight, the surface quality is of decisive importance. The surface resistance and thus the quality factor Q of the resonators, particularly depend upon the surface quality. To achieve a high quality factor, the surface resistance, which causes losses in the alternating current, must be kept as low as possible.

Another important parameter for the use of a superconducting cavity resonator is the so-called "critical magnetic field." In order to avoid alternating current losses, which are connected with the magnetizing properties of the super-conducting material, the cavity resonators must be operated so that the lower critical magnetic field $H_{cl}$ will not be exceeded. In order to achieve high high-frequency powers despite it, the critical magnet field $H_{cl}$ should therefore be the highest possible. For this reason, niobium is particularly interesting as a material for superconducting cavity resonators, since niobium has the highest lower critical magnetic field $H_{cl}$ (approximately 170 mT) of all the superconducting materials which can be considered to be used in connection with alternating currents. This critical magnetic field $H_{cl}$ measured in magnetic constant fields heretofore could not be attained when alternating currents were used. Rather, the critical magnet fields ($H_c^{ac}$) measured in niobium cavity resonators, under the influence of alternating fields, are considerably below $H_{cl}$. This effect also can be traced back to surface disturbances of the niobium.

In order to obtain a high quality for the niobium cavity resonator by reducing the surface resistance and in order to increase the magnetic field ($H_c^{ac}$), it had been attempted heretofore to provide smooth contamination free niobium surfaces, through appropriate surface processing. Chemical polishing processes and annealing methods were employed to this end. The latter annealing processes were supposed, in addition to cleaning the niobium surface by de-gassing, also to provide a growth of the niobium grain, thus in order to reduce the number of grain boundaries at the niobium surface ["Journal of Applied Physics" 39(1968), pages 4,417 to 4,427 ]

These known methods, however, have various disadvantages. The annealing by degassing, frees the niobium of undesired, gaseous contaminations, particularly of undesirable oxygen, but may simultaneously cause a worsening of the surface as a result of the outgrow of peaks. Therefore, alternating degassing and chemical polishing treatments were carried out. An attempt was also made to protect the degassed or polished surfaces against renewed contaminations, by precluding the surface from the exposure of air by assembling the resonators under protective gas ["Applied Physics Letters" 13 (1968), pages 390 to 391; "Applied Physics Letters" 16 (1970), pages 333 to 335].

Such activity entails expensive measures, such as work in a glove box, etc., which measures are hard to carry out technically, during the construction of larger appliances. Also the annealing by degassing of the finished resonator components lasts for many hours, is time-consuming and requires expensive equipment, since it must be performed at temperatues of about 2,000° C, in ultra high vacuum, especially if the parts to be treated must be of large dimensions. Moreover, the annealing by degassing does not always produce desired results since various processes take place which are hard to follow, in detail. Frequently, there is also the difficulty that the niobium parts, which are heated almost up to the melting point, may deform during annealing.

It is an object of the invention to increase the quality factor and/or the critical magnetic field ($H_c^{ac}$) of superconducting niobium cavith resonators.

To this end and in accordance with the invention, the niobium surface which is adjacent to the resonator cavity is proviced by anodic oxidation, at least partly, with a niobium oxide layer.

The invention is based on the surprising discovery that to increase the quality or the critical magnetic field of niobium cavity resonators, it is unnecessary, contrary to previous opinion to maintain the niobium surface free and bare from all outside influences, but rather that such an increase can be obtained through a planned application of a niobium oxide layer, by anodic oxidation. This is totally unexpected since the unavoidable air oxidation at room temperature of the niobium surface is extremely detrimental, contrary to the anodic oxidation. The method of the present invention, in addition to its simple execution, offers the advantage that the anodically oxidized niobium parts may be exposed to normal laboratory atmosphere, without causing a fundamental worsening. Thus, the anodic oxidation obviously offers, in addition to an increase in the quality or the critical magnetic field, also a considerably preservation of the good qualities once they are achieved. The handling of the cavity resonators and particularly the assembly of accelerators is greatly simplified thereby. Moreover, there are indications that the anodically produced niobium oxide layer has the further beneficial effect of preventing field emissions which can lead, particularly in the case of high fields, to considerable additional losses and, hence, to a strong impairment of the quality.

The anodically produced niobium oxide layers are not superconducting and usually consist of niobium pentoxide ($Nb_2O_5$) but can, eventually, also contain components of the electrolyte used during the anodic oxidation. The niobium oxide layers as a rule are amorphous.

Though it generally appears favorable to oxidize anodically, the entire niobium surface which borders the resonator cavity, in certain cases such as for example in special field types such as TM field types. or if an oxidation of the entire niobium surface is not feasible for technical reasons, it may be preferred to oxidize only specific regions of the niobium surface or to provide such regions with thicker niobium layers, than the other regions. Particularly those regions should be considered in this connection, which have the highest electrical or magnetic field intensities, or such regions which, with regard to manufacturing, have unfavorable mechanical properties, e.g., surface tensions or surface roughnesses.

Tests have shown that niobium oxide layers, with a thickness exceeding 0.01 μ are particularly preferred. Particularly great increases in the quality and of the critical magnetic field were obtained with layers approximately 0.1 to 1 μ in thickness.

The niobium oxide layer, produced by anodic oxidation, should not be thicker than 10 μ. Thicker layers through anodic oxidation, in a dense and uniformly smooth form are hard to produce while no additional improvement can be expected from the thicker layers.

The anodic oxidation may be carried out in alkaline as well as in acid baths. An aqueous ammonia solution is preferably used as the bath.

Particularly suitable for obtaining tightly adhering, uniformly developed, cohesive and dense niobium oxide layers, was found to be an aqueous ammonia solution with 20 to 30 percent by weight ammonia.

In order to obtain the best possible planar and clean initial conditions for the niobium surface, to be oxidized, the niobium surface is preferably subjected, prior to the anodic oxidation, to a pretreatment for improving the surface quality. Such pretreatment is preferably an electrolytical or chemical polishing. In order to produce a growth in the grainage, a recrystallization annealing process may be preferred as the pretreatment. It may further be favorable to avoid contacting the niobium surface with air, between the pretreatment and the anodic oxidation.

It was also found preferable to carry out the anodic oxidation in two steps; first preoxidizing the niobium surface removing the resultant niobium oxide layer by chemical means and, thereafter producing a niobium oxide layer at the niobium surface, through a renewed anodic oxidation.

The invention will be disclosed in greater detail with reference to the following Examples, with reference to the Drawing.

EXAMPLE 1

A circular cylindrical $TE_{011}$ field type cavity resonator for a frequency of 9.5 GHz was constructed in two parts. This consisted of a cup shaped bottom portion with an inner diameter and an inside height of 41 mm and a disc shaped cover. The bottom part and the cover are sealed against each other in vacuum tight relation during the operational state, by means of a circular indium packing ring. This indium packing is situated in a groove on the front side of the cup shaped bottom portion which faces the cover. For the purpose of coupling-in the microwave energy, two coupling holes with a diameter of 1.5 mm are provided in the cover. One of these coupling holes also serve for the evacuation of the resonator's interior.

The bottom portion and the cover of the resonator were machined from or turned out entirely of solid niobium material with large crystal grains. The surface roughness depth following the turning, was to approximately 1 μ. After the turning, the lower portion and the cover were chemically polished for 5 minutes, in a bath consisting of 60 percent by volume of concentrated nitric acid and 40 percent by volume of 40 percent hydrofluoric acid, with a bath temperature of about 20° C. An approximately 50 μ thick layer was removed thereby from the niobium surface.

After rinsing with distilled water and acetone, the resonator was assembled in laboratory air installed into a suitable cryostat, evacuated and cooled. Following an evacuation period of approximately 15 hours by a turbomolecular pump, an unstressed or unloaded quality $Q_o$ of about $6 \cdot 10^9$ was measured at a temperature of about 1.5 K, in a critical magnet field $H_c^{ac}$ of about 22 mT. The critical magnet field $H_c^{ac}$ is that magnetic field at the resonator surface which when exceeded, causes the $Q_o$ to be reduced by several orders of magnitude, within a few microseconds.

The same resonator was then subjected to anodic oxidation following heating to room temperature. At the same time, the cup shaped resonator bottom portion, itself, was used as a vessel for the oxidation bath. Immediately prior to anodic oxidation, the bottom part was again chemically polished for about 20 seconds in the aforementioned bath of nitric acid and hydrofluoric acid, during which a niobium layer of 3 μ thickness was removed. Subsequently, for the anodic oxidation, the lower portion was filled up to its rim with an aqueous ammonia solution containing 25 percent ammonia. Care was simultaneously taken that the ammonia solution not wet the front face of the lower part which contains the groove for the indium ring so that no oxidation could occur at this front face. The bottom portion filled with the ammonia solution, was connected with the plus pole of a constant current source. A niobium tube, as a cathode, was dipped approximately 30 mm into the bath and coaxially to the cylindrical axis of the lower part of the resonator, the outer diameter of the niobium tube was about 20 mm. The bath temperature was about 25° C.

The anodic oxidation was carried out in two steps, namely a preoxidation and a main oxidation. For the purpose of effecting a preoxidation, the inner surface of the resonator bottom part was oxidized at a current density of 3 mA per $cm^2$, until a final voltage of 20 Volt was attained between anode and cathode. The thin niobium oxide layer which resulted therefrom, was loosened with 40 percent hydrofluoric acid, after the bottom part of the resonator had been emptied.

Subsequently, in order to carry out the main oxidation the bottom part of the resonator was again filled with the ammonia solution and, following the immersion of the cathode and the connection of the constant current source, was again anodically oxidized for about 10 minutes at a current density of 3 $mA/cm^2$, until a final voltage of 100 Volt was obtained. The thickness of the resultant niobium oxide layer was approximately 0.4 μ.

The resonator cover was treated in the same manner. Since it is not suitable as a vessel for the bath itself, for anodic oxidation, it was immersed in horizontal position into a container of an appropriate plastic such as propylene. The container was filled with the ammonia solution. The bearing surface for the indium ring was covered, in order to prevent oxidation at this location. A niobium wire was used as a connecting lead to the plus pole of the constant current source. The cathode was again represented by the niobium tube which was immersed into the bath, above the center of the resonator cover.

Following the anodic oxidation, the bottom and the cover parts of the resonator were rinsed with water and acetone, assembled and after their installation into an appropriate cryostat, evacuated and cooled.

After an evacuation period of about 15 hours, an unstressed quality $Q_o$ of about $1.1 \cdot 10^{10}$ was measured at a temperature of approximately 1.5 K, at a critical magnet field $H_c^{ac}$, of about 33 mT. Compared to the nonoxidized state, the $Q_o$ was thus increased by about the factor 2 and $H_c^{ac}$ by about the factor 1.5. The quality $Q_o$ of about $1.1 \cdot 10^{10}$ at approximately 1.5 K, corresponds to a quality $Q_{o\ res}$ of about $2 \cdot 10^{10}$, relative to the surface resistance alone. An example of a superconducting cavity resonator treated according to the method of the invention, the resonator described in detail in Example 1, is simultaneously shown in the Figure.

In the Figure, the disc shaped cover 2 is mounted upon the cup shaped lower portion 1 of the resonator. The indium ring 3 serves as a packing between the lower part 1 and the cover 2 and is situated in a groove 4 at the front side of the cup shaped lower part 1, that faces the cover 2. To effect a tight assembly, the cover and the bottom portion are interconnected by screw bolts which may be led through the bores 5 that are provided in the cover and in the bottom portion. To couple-in the microwave energy, two coupling holes 6 and 7 are provided in the cover 2 and end into the resonator cavity 8. To facilitate the coupling-in of the hollow or tubular conductors, which are used for supplying the microwave energy, two depressions 9 and 10 of rectangular cross-section are embedded into the cover 2 and serve as coupling flues or chimneys. The walls of the bottom part 1 which are adjacent to the resonance cavity 8 are coated with a niobium oxide layer 11. Likewise, there is a niobium oxide layer 12 at the bottom face of cover 2 which faces the resonator cavity. The niobium oxide layer 12 extending up to the indium ring 3, and reaches also into the coupling holes.

EXAMPLE 2

Another circular cylindrical $TE_{011}$ field type cavity resonator for a frequency of 9.5 GHz, of the same construction and having the same dimensions as the resonator described in Example 1, was annealed following the chemical polishing, in the nitric acid hydrofluoric acid bath, for the purpose of degassification. The annealing lasted for about 15 hours, at a temperature of about 2,000° C and was carried out under high vacuum, with a residual gas pressure of less than $10^{-8}$ Torr. The resonator, which had no further use for the time being, was left standing for several months in laboratory air, following this annealing process. Following this, the resonator was again chemically polished in the nitric acid-hydrofluoric acid bath and an approximately 50 μ thick niobium layer was removed, during several polishing steps. After being washed with distilled water and acetone, the resonator was assembled and measured under the same conditions as in Example 1. An unstressed quality $Q_o$ of about $5 \cdot 10^9$ was obtained with a critical magnet field $H_c^{ac}$ of about 35 mT.

The resonator was then disassembled and anodically oxidized according to Example 1, after a renewed chemical polishing process. At the anodically oxidized resonator, an unstressed quality $Q_o$ of about $8 \cdot 10^9$ could be obtained under the same conditions as in Example 1, at a critical magnet field $H_c^{ac}$ of about 52 mT. Thus, the anodic oxidation helped to increase the critical magnetic field $H_c^{ac}$ by the factor 1.5 and the quality $Q_o$ by the factor 1.6.

The process of anodic oxidation can be widely modified compared to the embodiments. For example, rather than with a constant current, work can be carried out with a constant voltage, e.g., by gradually increasing the voltage in steps of 20 volts, each, from 20 to 100 volts, switching over to the next higher step after the current has dropped to 25 percent of the original value. Moreover, with the indicated 25 percent ammonia solution, a constant voltage of 100 volts can be applied immediately without causing considerable disadvantages.

The preoxidation following which the resultant niobium-oxide layer is again peeled off, was found favorable for producing a chemically defined initial condition in the niobium surface, but may be omitted, if necessary.

As specific examples show, the invention permits in niobium cavity resonators, to increase the unstressed quality $Q_o$ within a temperature range of 1.5 K, where the surface resistance of the niobium makes itself decisively felt, by the factor of at least 1.6. The invention also permits the increase of the critical magnetic field $H_c^{ac}$ within the same temperature range, by about the factor 1.5. These improvements in the resonator characteristics are by no means limited to TE field type cavity resonators, but can be achieved also in cavity resonators of other field types, as for example, TM field type cavity resonators. A further increase in the absolute values of $Q_o$ and $H_c^{ac}$ can be obtained by avoiding contact of the niobium surface by air, between the pretreatment, for example the chemical polishing, and the anodic oxidation.

What is claimed is:

1. A process for the surface treatment of superconducting niobium cavity resonators which comprises at least partially providing the resonator cavity with a niobium oxide layer by anodic oxidation.

2. The process of claim 1, wherein the niobium oxide layer is produced with a thickness of 0.01 μ to 10 μ.

3. The process of claim 2, wherein the niobium oxide layer is produced with a thickness of 0.1 μ to 1.0 μ.

4. The process of claim 1, wherein the anodic oxidation is carried out in an aqueous ammonia solution.

5. The process of claim 4, wherein the aqueous ammonia solution contains 20 to 30 percent by weight of ammonia.

6. The process of claim 1,wherein the niobium surface is given a pretreatment prior to anodic oxidation in order to increase the surface properties.

7. The process of claim 6, wherein air is excluded from the niobium surface between the pretreatment and the anodic oxidation.

8. The process of claim 1, wherein the niobium surface is anodically oxidized, the niobium oxide layer is then chemically dissolved and thereafter the niobium surface is anodically oxidized to provide a new niobium oxide layer.

* * * * *